United States Patent [19]

Miller

[11] Patent Number: 5,076,824
[45] Date of Patent: Dec. 31, 1991

[54] METHOD OF MAKING FIBER OPTICAL PREFORM WITH PYROLYTIC COATED MANDREL

[75] Inventor: Thomas J. Miller, Alpharetta

[73] Assignee: AT&T Bell Laboratories, Murray Hill, N.J.

[21] Appl. No.: 522,613

[22] Filed: May 14, 1990

[51] Int. Cl.$^5$ .............................................. C03C 25/02
[52] U.S. Cl. .............................. 65/3.12; 65/DIG. 16; 65/900; 65/60.6
[58] Field of Search ...................... 65/3.11, 3.12, 3.14, 65/3.2, 3.41, 18.1, 18.3, 60.6, 900, DIG. 16

[56] References Cited

U.S. PATENT DOCUMENTS

| | | |
|---|---|---|
| 4,165,223 | 8/1979 | Powers .................... 65/32.1 |
| 4,217,027 | 8/1980 | MacChesney et al. ............ 350/96.3 |
| 4,251,251 | 2/1981 | Blankenship ........................ 65/3.12 |
| 4,335,934 | 6/1982 | Black et al. ........................ 65/3.12 |
| 4,362,545 | 12/1982 | Bailey et al. ........................ 65/169 |
| 4,450,333 | 5/1984 | Andrejco et al. ................. 219/10.49 |
| 4,629,485 | 12/1986 | Berkey ................................ 65/3.11 |
| 4,643,751 | 2/1987 | Abe .............................. 65/DIG. 16 |
| 4,648,891 | 3/1987 | Abe .............................. 65/DIG. 16 |
| 4,668,263 | 5/1987 | Yokota et al. ................. 65/DIG. 16 |
| 4,734,117 | 3/1988 | Dilon et al. ........................ 65/3.12 |
| 4,772,302 | 9/1988 | Abe .............................. 65/DIG. 16 |
| 4,812,155 | 3/1989 | Kyoto et al. ........................ 65/3.12 |
| 4,820,322 | 4/1989 | Baumgart et al. .................... 65/3.11 |
| 4,968,339 | 11/1990 | Miller et al. ................. 65/DIG. 16 |
| 4,969,941 | 11/1990 | Kyoto et al. ................. 65/DIG. 16 |
| 4,979,971 | 12/1990 | Kyoto et al. ................. 65/DIG. 16 |

FOREIGN PATENT DOCUMENTS 161680 11/1985 European Pat. Off. .
55-67533 5/1980 Japan .
56-50136 5/1981 Japan .
57-183332 11/1982 Japan .
61-67005 4/1986 Japan .
62-96339 5/1987 Japan .
63-123826 5/1988 Japan .

OTHER PUBLICATIONS

Kanamori et al., Fluorine doping in the VAD method ECOC 83-9th European Conference on Optical Communications, edited by Melchior and Sollberger, Elsevier Science Publishers B. V. (North Holland) 1983; pp. 13-16.
"Fabrication of Optical Wave Guides by the Vapor Deposition Process," by P. C. Schultz, Proceedings of the IEEE, vol. 68, No. 10, Oct. 1980, pp. 1187-1190.
William H. Smith et al., "Pyrolytic Graphite," in Modern Materials, Advances in Development and Applications, edited by B. W. Gonser, (Academic Press, 1970) vol. 7, pp. 139-158 et seq.
A. W. Moore, "Highly Oriented Pryolytic Graphite," in *Chemistry and Physics* of Carbon, edited by P. L. Walker, Jr. and P. A. Thrower, (Marcel Dekker, Inc., 1973) vol. 11, pp. 69-82 et seq.

*Primary Examiner*—Richard V. Fisher
*Assistant Examiner*—John J. Bruckner
*Attorney, Agent, or Firm*—R. B. Anderson

[57] ABSTRACT

A mandrel (12) that is used for supporting a glass soot cylinder during consolidation into anoptical fiber preform is coated by chemical vapor deposition with a material selected from the group consisting of pyrolytic graphite and pyrolytic boron nitride.

19 Claims, 3 Drawing Sheets

METHOD OF MAKING FIBER OPTICAL PREFORM WITH PYROLYTIC COATED MANDREL

TECHNICAL FIELD

This invention relates to methods for making doped glass bodies and, more particularly, to methods for making optical fibers having depressed refractive index outer claddings.

BACKGROUND OF THE INVENTION

Optical fibers have become increasingly important as a medium for transmitting large quantities of information in the form of lightwaves. Each optical fiber comprises a thin solid glass cylinder, known as the core of the fiber, surrounded by an outer layer, known as the cladding, which has a lower refractive index than the core. One way to make such fiber is to make a glass tube, called a substrate tube, and then to vapor-deposit glass that will eventually constitute part of the cladding and the core on the inner surface of the tube as taught, for example, in the U.S. patent of MacChesney, et al. U.S. Pat. No. 4,217,027 granted Aug. 12, 1980, now generally known as the modified chemical vapor deposition (MCVD) technique. After deposition, the entire structure is collapsed to make a preform rod, and glass drawing techniques are used to form a continuous optical fiber from the preform. One way of obtaining the required difference of refractive indices is to dope the glass that will constitute the cladding layer with fluorine, which depresses or reduces its refractive index with respect to that of undoped glass.

For large preforms, an oversized core is deposited in the substrate tube and the collapsed preform rod is inserted into a second tube, called an overclad tube, that is collapsed onto the rod. This is the hybrid or "rod-tube-tube" approach as described, for example, in the U.S. patent of J. W. Baumgart et al., U.S. Pat. No. 4,820,322, granted Apr. 11, 1989. One may likewise wish to dope such overclad tubes with fluorine to depress their refractive indices.

Fluorine-doped glass tubes for use either as substrate tubes or as overclad tubes may be made, first, by depositing glass soot on a mandrel to form a cylindrical porous soot form of glass particulate. Fluorine can be introduced as a dopant by adding a fluorine-containing gas to the reactant stream of the torch during soot deposition, or by adding a fluorine-containing gas to the furnace atmosphere at a temperature below the consolidation temperature. The deposited porous soot cylinder is then consolidated into a glass tube by heating the soot cylinder, which is mounted on a mandrel, in a furnace.

A problem that has been encountered in making fluorine-doped glass tubes is the corrosive damage done to the supporting mandrel by the highly reactive fluorine. This is particularly a problem in the consolidation furnace in which the soot cylinder must be supported by a mandrel for a sufficient period of time at a high temperature to permit sintering or consolidation into a glass cylinder. Other reactive vapors such as chlorine and oxygen also tend to attack the mandrel, which is typically made of graphite. The damage can cause graphite particles to break off and to become entrapped within the consolidated glass substrate, reducing the quality of the glass. The mandrels are often so badly damaged during this process that they cannot be reused. The problem of mandrel damage has been recognized for some time, and it can occur during the soot deposition process as well as during the consolidation process.

SUMMARY OF THE INVENTION

In accordance with the invention, the mandrel that is used for supporting the soot cylinder during either soot deposition or consolidation is coated with a material selected from the group consisting of pyrolytic graphite and pyrolytic boron nitride. I have found that either of these coatings is capable of withstanding the high temperatures of consolidation, is resistant to attack by fluorine, chlorine and oxygen at the consolidation temperature, is inert to either doped or undoped silica glass at the consolidation temperature, does not contaminate the glass, and is amenable to machining. This coating is preferably made on a mandrel substrate of solid graphite to which it adheres well under the conditions of use. It is preferably deposited on the graphite mandrel by chemical vapor deposition to a thickness of between about 0.001 inch and about 0.05 inch. The invention is particularly beneficial when used in a closely confined enclosure for consolidating the soot cylinder within a stagnant atmosphere saturated with reactive fluorine gas. Use under these conditions is particularly damaging to conventional graphite tubes, but such damage is virtually completely obviated through the use of the invention.

These and other objects, features and benefits of the invention will be better understood from a consideration of the following detailed description taken in conjunction with the accompanying drawing.

DETAILED DESCRIPTION

Figure 1:
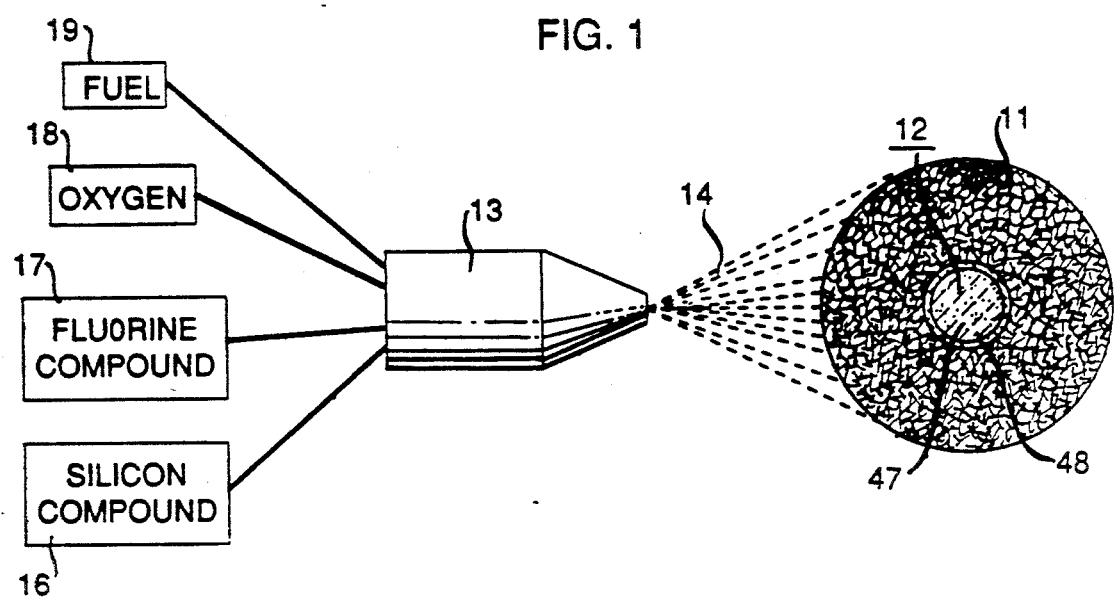
FIG. 1 is a schematic view of apparatus for making a soot cylinder, including a coated mandrel which may be used in accordance with an illustrative embodiment of the invention.

It is to be noted that the drawings are only illustrative and symbolic of the invention, and the scale or relative proportion of the elements shown is not necessarily accurate. Further, it is to be noted that the present invention explicitly contemplates both single mode and multimode optical fiber lightguides, regardless of any specific description in the drawing or example set forth herein. FIGS. 1-5 represent sequential steps in a process for making optical fiber within which the invention may be used. FIG. 4 represents an optional step in the production of such optical fiber.

Referring now to FIG. 1, there is illustrated a known method for forming a soot cylinder 11 on a mandrel 12 which may be used in the optical fiber making process. Gaseous components are mixed in a burner 13 which emits a flame 14 within which silicon may be reacted to form silicon dioxide (silica soot) that is deposited on the mandrel to constitute the soot cylinder 11. As is known in the art, a silicon-containing gas from a source 16, a fluorine-containing gas from a source 17, an oxygen-containing gas from a source 18 and gaseous fuel from a source 19, are combined in the burner or torch for projection toward the soot cylinder 11. As described, for example, in the aforementioned MacChesney et al. patent and in the paper, "Fabrication of Optical Wave Guides by the Vapor Deposition Process," by P. C. Schultz, *Proceedings of the IEEE*, Vol. 68, No. 10, October, 1980, pps. 1187–1190, any of various gases may be used as the silicon-containing, fluorine-containing, oxygen-containing and fuel gases; e.g., the silicon compound may illustratively be $SiCl_4$, the fluorine compound may be $SiF_4$, the oxygen may be $O_2$ and the fuel may be hydrogen. The purpose of the fluorine is to depress the refractive index of the final glass product.

Figure 2:
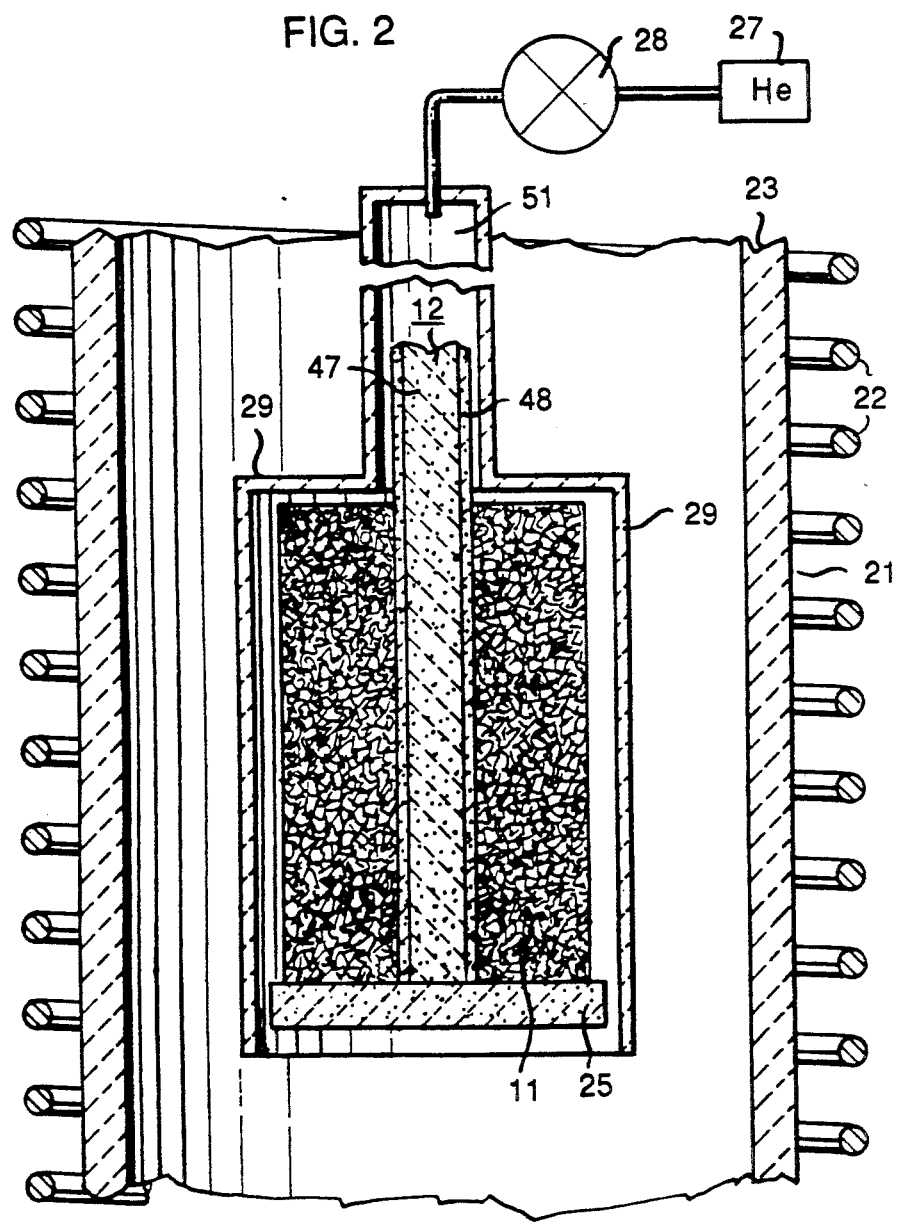
FIG. 2 is a schematic sectional view of apparatus for consolidating the soot cylinder, including a coated mandrel which may be used in accordance with an illustrative embodiment of the invention.

After its formation, the soot cylinder 11 (also sometimes known as a soot boule or soot form) is consolidated or sintered within a furnace 21 as shown in FIG. 2. The soot cylinder is supported by a mandrel 12, which may be either the same or different from the mandrel 12 of FIG. 1, and a pedestal 25. The furnace, as is well known, comprises heating elements 22 which may be in the form of a conductive coil or a plurality of conductors. It also typically includes a muffle 23, which is a cylinder of refractory material used for maintaining the heat balance within the furnace. Prior to consolidation, the soot cylinder is purged by flowing past it and through it helium from a source 27. This flow is preferably shut off during consolidation, illustratively by a valve 28.

In accordance with the copending application of T. J. Miller et al., Ser. No. 459,605, filed Jan. 2, 1990, and assigned jointly to the assignee company of the present application and a subsidiary company thereof, during consolidation, the soot cylinder 11 is encased by a gas-impermeable encapsulation structure 29 which may be of quartz or a similar material that is unlikely to contaminate the porous soot cylinder 11. The volume enclosed by the encapsulation structure 29 is only slightly larger than the volume enclosed by the soot cylinder 11; preferably, the ratio of the volume enclosed by encapsulation structure 29 to the volume enclosed by the soot cylinder 11 is 1.4:1 or less (for purposes of this calculation, the mandrel volume is considered to be part of the soot cylinder volume). The purpose of the encapsulation structure 29 is to confine fluorine gases within the soot cylinder and to cause the atmosphere surrounding the soot cylinder to be stagnant and substantially saturated with fluorine during consolidation, thereby to make a more uniform refractive index profile across the width of the consolidated glass tube as a consequence of a uniform distribution of fluorine within encapsulation structure 29. For a sufficiently large soot cylinder, the furnace muffle 23 may act as the encapsulating structure.

Figure 3:
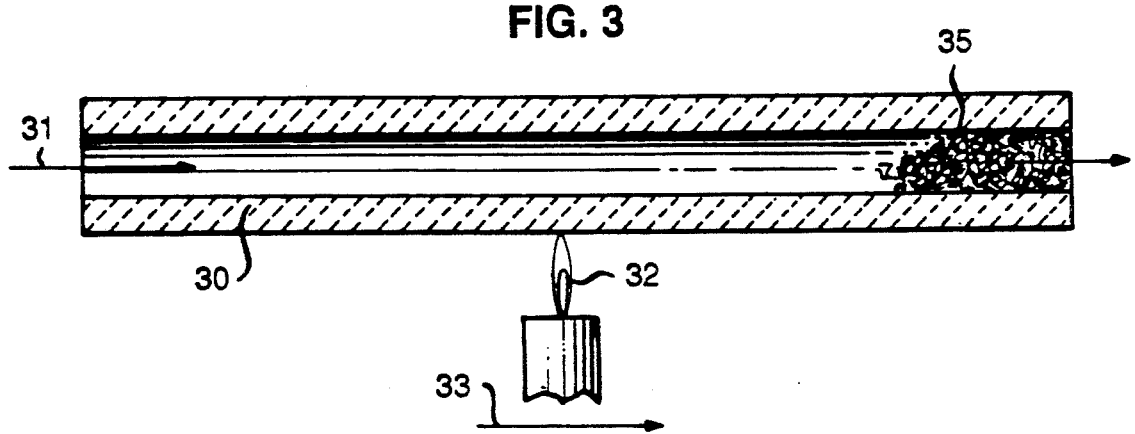
FIG. 3 is a schematic view of apparatus for depositing glass on the inner surface of a cylindrical substrate tube made by the apparatus of FIGS. 1 and 2.
Figure 4:
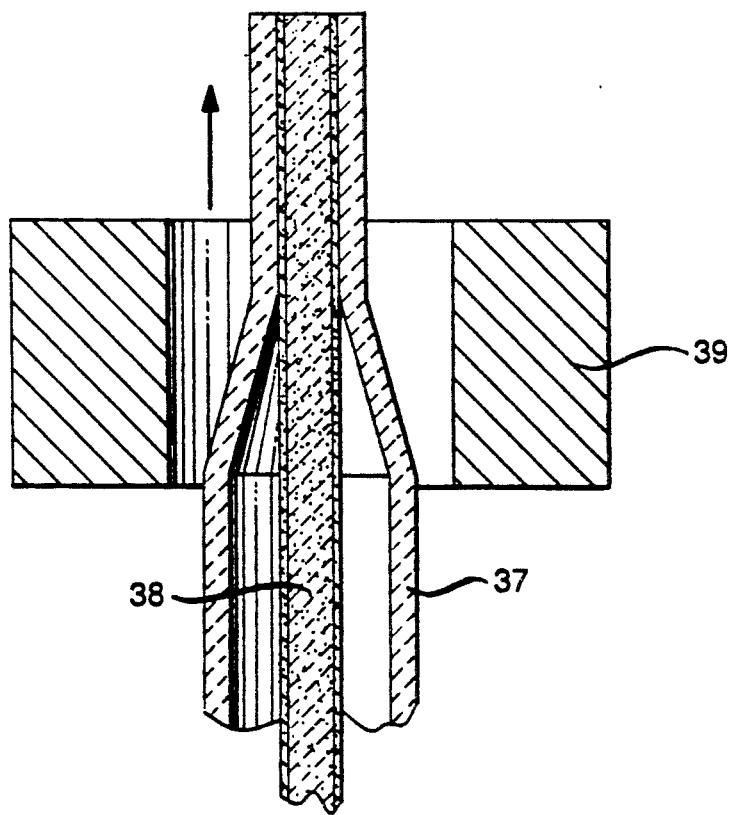
FIG. 4 is a schematic view of apparatus for optionally adhering an overclad tube to a preform made by the apparatus of FIG. 3.

After the soot cylinder 11 has been consolidated to form a solid glass tube, the mandrel 12 is removed and the tube is used as a substrate; that is, core material is deposited within the tube by the process shown schematically in FIG. 3. Although the tube may directly be used as a substrate tube, preferably the tube is drawn by conventional glass drawing techniques to increase its length and reduce its diameter prior to its use as a substrate tube. Substrate tube 30 is, of course, fluorine-doped glass made by the process of FIGS. 1 and 2. As described in more detail in the aforementioned MacChesney et al. patent, a silicon-containing gas, together with an oxygen-containing gas, are introduced onto the left end of the tube as shown by arrow 31. A flame 32 is moved axially along the tube as shown by arrow 33. The heat causes silicon to react with oxygen or oxygen-containing gas to form silicon dioxide particles which deposit on the inner wall of the substrate tube downstream from the flame. The high temperature flame traverses the area of deposited silica causing consolidation of the particles into a thin glass layer. Several layers are deposited in this manner until the desired composition profile and glass thickness are obtained. The deposited silicon dioxide (or silica) particles 35 may be undoped or may alternatively be doped (as known in the art) so as to have a different refractive index than that of undoped glass. Those particles 35 that will become part of the clad layer of the fiber are typically doped to have a different refractive index from those that will become part of the core.

After complete deposition of glass on the interior of the substrate tube 30, the substrate tube 30 is collapsed into a solid cylindrical preform structure. The outer portion of the preform structure conforms in composition to the substrate tube 30, while the inner portion corresponds in composition to the deposited glass 35. Optionally, according to the known "rod-in-tube" process of aforementioned Baumgart et al. patent, the cylindrical preform structure can be fitted into a larger overclad tube that is then collapsed to make a larger preform. Such overclad tube can be made by the process illustrated in FIG. 2. Referring to FIG. 4, an overclad tube 37 is fitted over a solid preform cylinder 38. An annular torch 39 surrounds the overclad tube and heats it to soften it. As the torch is moved in the downward axial direction, it causes the overclad tube 37 to collapse on, and bond to, the preform cylinder 38.

Figure 5:
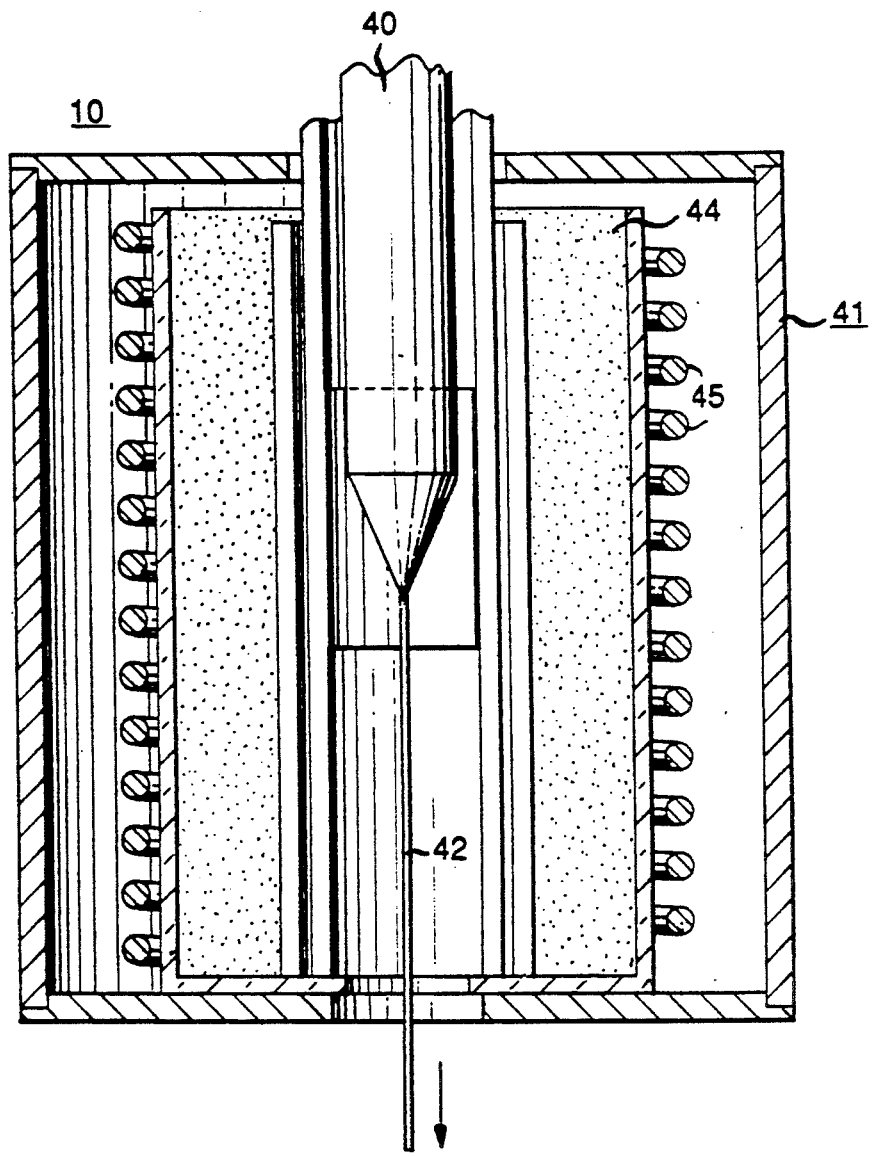
FIG. 5 is a schematic view of apparatus for drawing optical fiber from a preform made by the apparatus of FIGS. 1-3 or FIGS. 1-4.

Referring to FIG. 5, after fabrication of the preform 40, which may or may not include the overclad feature of FIG. 4, the preform is placed in a furnace 41 which heats and softens one end of it such that it may be grasped by a tool and drawn in the form of a partially-molten fiber 42. The furnace comprises zirconium dioxide granules 44 which are surrounded by an rf induction coil 45. The coil heats the zirconium dioxide granules, which in turn heats the preform 40. More details concerning furnace 41 and the glass drawing process are disclosed in the U.S. patent of Andrejco et al., U.S. Pat. No. 4,450,333, granted May 22, 1984. By virtue of the fluorine doping of the outer or clad layer, the fiber has a lower refractive index in the clad layer than in the core, as is required for good lightwave transmission.

Figure 6:
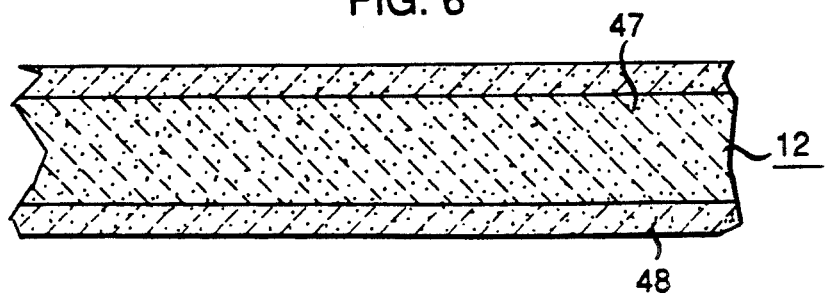
FIG. 6 is a sectional view of part of a mandrel that may be used with the apparatus of either FIG. 1 or FIG. 2.

Referring to FIG. 6, there is shown, in accordance with the invention, a portion of a mandrel 12 which may be used in the apparatus of FIG. 1 and/or FIG. 2. The mandrel comprises a central cylindrical substrate portion 47 which is coated with a coating 48, which may be composed of either pyrolytic graphite or pyrolytic boron nitride. The purpose of the coating 48 is to protect the mandrel from the corrosive effects of reactive gases, particularly fluorine, in the consolidation furnace depicted in FIG. 2. The coating 48 is preferably deposited on a graphite substrate by chemical vapor deposition, a process that is well known and is described, for example, in the book *Modern Materials, Advances in Development and Applications*, edited by Bruce W. Gonser, Academic Press, 1970, Vol. 7, pages 139–158 et seq. The coating preferably has a thickness of between about 0.001 inch and 0.05 inch. The coating should be thick enough to withstand the corrosive effects of fluorine during at least one and preferably several operations of the consolidation furnace, and in principle the mandrel could be solid pyrolytic graphite or pyrolytic boron nitride. These materials are quite expensive, however, and a thickness of 0.05 inch provides ample protection not only from fluorine, but from chlorine and oxygen, which are also reactive at the high temperatures needed for consolidation and may be present, albeit to a lesser extent than fluorine. Although only a portion of the mandrel is shown in FIG. 6, it is important that the entire surface of the mandrel that may be exposed to the consolidation furnace environment be coated with the protective coating 48. The coating protects against the reactive gases, does not in any manner contaminate the soot cylinder or the consolidated glass cylinder, and is practical to form by machining.

Since optical fiber is now a commodity product, it is important that the expense associated with this manufacture be minimized. If one exceeds a thickness of 0.05 inch, one would increase the cost of the mandrel and, in the case of a boron nitride coating over a graphite substrate, one would incur a thermal mismatch problem, i.e., a problem of differential thermal expansion and contraction of the coating with respect to the graphite substrate. Since the consolidation step shown in FIG. 2 may be used to make overclad tubes as well as substrate tubes, it is important to minimize both the cost and the thermal mismatch.

As shown in FIG. 1, the coated mandrel 12 may also be used during the soot deposition step, although the problems of corrosion are not as pressing during this step because the temperatures are not as high. The temperature used for soot deposition is typically about 1000° C. while the temperature used during soot consolidation is typically 1400°–1500° C. Also, the mandrel is rapidly coated with layers of soot which tend to isolate the mandrel from the oxidizing environment of the flame. FIGS. 1 and 2 show for purposes of illustration the same mandrel 12 being used during soot deposition as for consolidation. In fact, I have found that it is preferable to use a different mandrel of slightly smaller diameter for soot consolidation than for soot deposition. With a smaller mandrel, one can establish a three to five millimeter gap between the inner surface of the soot cylinder and the outer surface of the mandrel during the consolidation step of FIG. 2. This small gap will permit the circulation of fluorine to the inner surface of the soot cylinder, whereas, without such a gap, the equalization of fluorine concentration at the inner surface of the soot cylinder with respect to all other locations within the soot cylinder would be somewhat more difficult. While the mandrel 12 used in FIG. 1 may be graphite coated with pyrolytic boron nitride or pyrolytic graphite as described before, I have found that it is often satisfactory to use for this purpose a mandrel of solid aluminum oxide. Such a mandrel is unsatisfactory for use within the consolidation furnace, but at the temperatures used for soot deposition, it is typically satisfactory.

Numerous mandrel materials other than pyrolytic graphite and pyrolytic boron nitride were tried but were found to be unsatisfactory for use during the consolidation step. Aluminum oxide and silicon carbide, for example, react at the high consolidation temperatures with the silicon dioxide, which damages the mandrel and contaminates the consolidated glass. Pyrolytic boron nitride and pyrolytic graphite were both found to be resistant to attack not only from fluorine, but from chlorine and oxygen, which also may be present in the consolidation furnace and are highly reactive at the extremely high temperatures used in the furnace. Typically during the step of purging the soot cylinder with helium from source 27, one also includes a small amount of chlorine for dehydration purposes. It is difficult to purge all of the chlorine and any that remains will be damaging if any part of the mandrel is capable of reacting with it. Likewise, small amounts of oxygen may originate from the silicon dioxide glass soot, or may be entrapped by the soot and is highly reactive at the high consolidation temperature. My experiments have shown that the pyrolytic boron nitride and pyrolytic graphite coatings are also inert to either doped or undoped glass at the consolidation temperature, do not contaminate the glass, and are amenable to machining. This latter consideration is important for proper sizing of the mandrel with respect to the soot cylinder that it is to support in the consolidation furnace.

The various embodiments shown and described are intended to be only illustrative of the principles of the invention and of the sequence of process steps within which it is applicable. For example, materials other than graphite may be used for the mandrel substrate. The invention may be found to be useful with reactive dopants other than fluorine. Various other embodiments and modifications may be made by those skilled in the art without departing from the spirit and scope of the invention.

I claim:

1. A method for making optical fibers comprising the steps of: forming a hollow cylinder of first silica soot, the cylinder having a central opening; consolidating the hollow soot cylinder to form a substrate tube; depositing second silica on an inner surface of the substrate tube; forming a preform by collapsing the coated substrate tube; and drawing optical fiber from the preform, characterized by:

providing a solid mandrel substrate forming a coating by chemical vapor deposition the solid mandrel substrate to make a coated mandrel;

the coating being of a material selected from the group consisting of pyrolytic graphite and pyrolytic boron nitride;

mounting the hollow soot cylinder on the coated mandrel by inserting the coated mandrel into the central opening of the soot cylinder;

and using the coated mandrel to support the hollow soot cylinder during the step of consolidating the hollow soot cylinder.

2. The method of claim 1 further characterized in that:

the mandrel substrate comprises solid graphite.

3. The method of claim 1 further characterized in that:

the coating thickness is between about 0.001 inch and about 0.05 inch.

4. The method of claim 1 further characterized in that:

the step of forming the hollow cylinder includes the step of doping the hollow cylinder with a reactive dopant.

5. The method of claim 4 further characterized in that:
the reactive dopant is fluorine.

6. The method of claim 4 further characterized in that:
the first silica soot cylinder has a first reactive index;
at least part of the second silica has a second refractive index that is higher than the first refractive index;
and the optical fiber has a cladding layer, surrounding a central core region, which has a lower refractive index than that of the core region.

7. The method of claim 4 further characterized in that:
the step of consolidating the hollow soot cylinder comprises the step of enclosing the hollow soot cylinder in an encapsulation structure, and thereafter heating the hollow soot cylinder in a substantially stagnant atmosphere within the encapsulating structure to a sufficient temperature to consolidate the soot cylinder.

8. The method of claim 7 further characterized in that:
the ratio of the volume enclosed by the encapsulating structure to the volume of the soot cylinder is less than about 1.4:1, whereby only a relatively small amount of the dopant is diffused into the volume enclosed by the encapsulating structure before reaching saturation;
and the consolidating step includes the step of heating the soot cylinder to a temperature of about 1400° C. to about 1500° C.

9. The method of claim 8 further characterized in that:
the reactive dopant is fluorine.

10. The method of claim 9 further characterized in that:
during the consolidation of the soot cylinder, a sufficient amount of the fluorine concentration within the soot cylinder is released to the volume enclosed by the encapsulating structure that the atmosphere contained by the encapsulating structure is substantially saturated with fluorine.

11. The method of claim 9 further characterized in that:
the step of forming the hollow soot cylinder comprises the step of directing a gaseous silicon-containing material and a gaseous fluorine-containing material through a flame toward a second mandrel such that silica soot impregnated with fluorine is deposited on the second mandrel.

12. The method of claim 11 further characterized in that:
the mandrel substrate comprises solid graphite.

13. The method of claim 12 further characterized in that:
the mandrel coating has a thickness of between about 0.001 inch and about 0.05 inch.

14. A method for making doped glass comprising the steps of:
forming a coating by chemical vapor deposition on a solid mandrel substrate to make a first coated mandrel;
the coating being of a material selected from the group consisting of pyrolytic graphite and pyrolytic boron nitride;
forming a hollow soot cylinder comprising the step of directing gaseous silicon-containing material and reactive material in a gaseous form through a flame toward a second mandrel such that silica soot impregnated with the reactive material is deposited on the second mandrel;
removing the hollow soot cylinder from the second mandrel;
mounting the hollow soot cylinder on the first coated mandrel by inserting the first coated mandrel into a central opening of the soot cylinder;
and heating the mounted hollow soot cylinder to a temperature in excess of about 1400° C. to consolidate the soot cylinder to a doped glass cylinder, whereby the mandrel is subjected to the reactive material at an extremely high temperature.

15. The method of claim 16 further characterized in that:
the mandrel substrate comprises solid graphite.

16. The method of claim 15 further characterized in that:
the coating thickness is between about 0.001 inch and about 0.05 inch.

17. The method of claim 16 further characterized in that:
the reactive material is fluorine.

18. The method of claim 14 further characterized by:
using the doped glass cylinder as a substrate tube in an MCVD process.

19. The method of claim 14 further characterized by:
using the doped glass cylinder as an overclad tube in a rod-in-tube process.

* * * * *

UNITED STATES PATENT AND TRADEMARK OFFICE
CERTIFICATE OF CORRECTION

PATENT NO. : 5,076,824
DATED     : December 31, 1991
INVENTOR(S) : T. J. Miller

It is certified that error appears in the above—identified patent and that said Letters Patent is hereby corrected as shown below:

Title Page, In the Abstract, line 2
  after "into" change "anoptical" to --an optical--.

Column 1, line 38
  change "tube-tube" to --in-tube--;

Column 2, line 26
  after "graphite" change "tubes" to --mandrels--.

Column 3, line 39
  change "copending application" to --U. S. patent--;

Column 3, line 40
  change "Ser. No. 459,605, filed Jan. 2, 1990" to
  --No. 4,968,339, granted November 6, 1990.--

Column 6, line 47
  after "substrate" insert a semicolon and paragraph;

Column 6, line 48
  after "deposition" insert --on--.

Column 8, line 35
  after "claim" change "16" to --14--.

Signed and Sealed this

Twenty-second Day of June, 1993

Attest:

MICHAEL K. KIRK

*Attesting Officer*     Acting Commissioner of Patents and Trademarks